United States Patent [19]

Tessier et al.

[11] Patent Number: 5,221,426
[45] Date of Patent: Jun. 22, 1993

[54] LASER ETCH-BACK PROCESS FOR FORMING A METAL FEATURE ON A NON-METAL SUBSTRATE

[75] Inventors: Theodore G. Tessier, Crystal Lake; John W. Stafford, St. Charles; William F. Hoffman, Wheeling, all of Ill.

[73] Assignee: Motorola Inc., Schaumburg, Ill.

[21] Appl. No.: 799,804

[22] Filed: Nov. 29, 1991

[51] Int. Cl.⁵ .......................................... H01L 21/306
[52] U.S. Cl. ................................... 156/643; 437/173; 156/634; 219/121.68
[58] Field of Search ................ 437/173, 174; 219/121.68, 121.67, 121.69; 156/625, 643, 634

[56] References Cited

U.S. PATENT DOCUMENTS

| | | | |
|---|---|---|---|
| 4,388,517 | 6/1983 | Schulte et al. | 437/173 |
| 4,448,636 | 5/1984 | Baber | 219/121.68 |
| 4,644,130 | 2/1987 | Bachmann . | |
| 4,684,437 | 8/1987 | Donelon et al. . | |
| 4,880,959 | 11/1989 | Baum et al. . | |
| 5,032,233 | 6/1991 | Yu et al. | 437/173 |
| 5,066,611 | 11/1991 | Yu | 437/173 |
| 5,093,279 | 3/1992 | Andreshak et al. | 156/643 |

OTHER PUBLICATIONS

*Metal Finishing Guidebook Directory 1987*, Metals and Plastic Publication, Inc. (1987) pp. 212-213.

*Primary Examiner*—Brian E. Hearn
*Assistant Examiner*—Linda J. Fleck
*Attorney, Agent, or Firm*—Douglas D. Fekete

[57] ABSTRACT

An improved laser etch-back process forms a metal feature on an area of a polymeric or other non-metallic substrate. The process comprises forming a metal layer on the area that includes a first, relatively thick section, and a second, relatively thin section. Thereafter, the metal layer is uniformly irradiated with a laser pulse, but not to vaporize metal from the thick section. Thus, the laser pulse selectively etches the thin section to remove the metal and expose the substrate, without disturbing the thick section, which forms the desired metal feature.

27 Claims, 2 Drawing Sheets

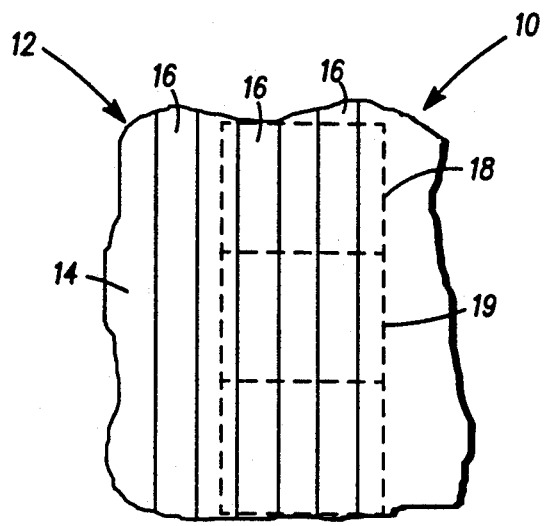
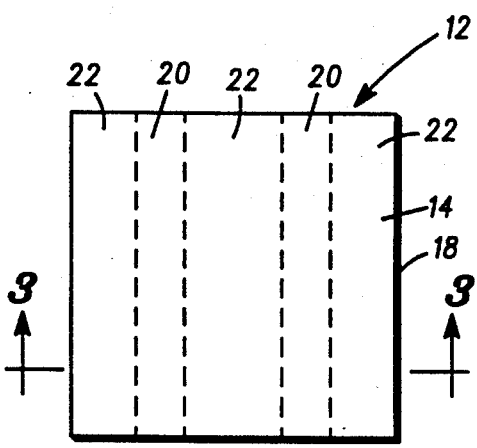
FIG.1    FIG.2
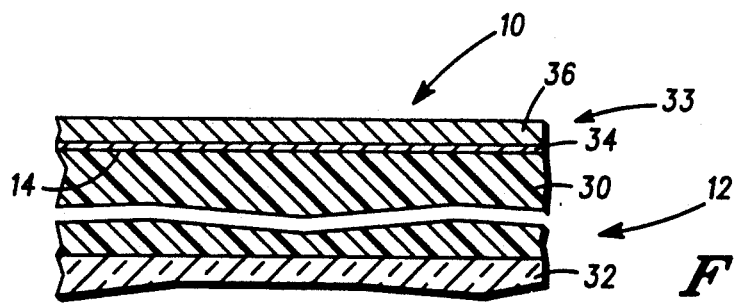
FIG.3A
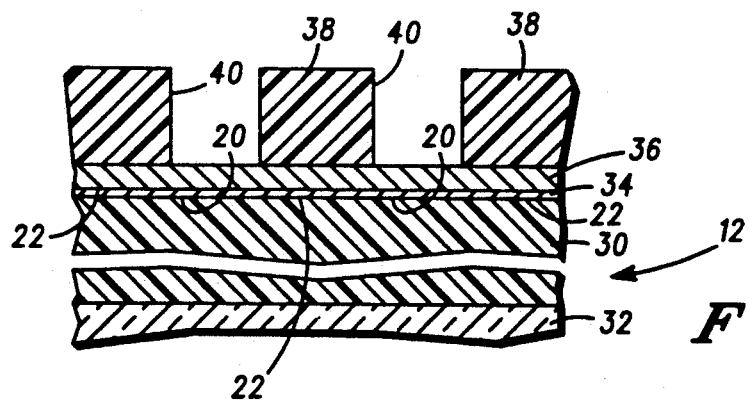
FIG.3B

LASER ETCH-BACK PROCESS FOR FORMING A METAL FEATURE ON A NON-METAL SUBSTRATE

BACKGROUND OF THE INVENTION

This invention relates to a process that utilizes a laser pulse to etch selected sections of a metal layer on a non-metallic substrate to form a patterned metal feature, such as a circuit trace or the like. More particularly, this invention relates to a laser etch-back process that forms a metal layer having a thick section and a thin section, and thereafter uniformly irradiates the layer with a laser pulse to remove the thin section without disturbing the thick section.

In the manufacture of a printed circuit board or the like, a metal circuit trace is formed on a non-metallic substrate to provide electrical connection between attached components. The trace is typically formed of copper having high electrical conductivity, whereas the substrate is formed of a dielectric material such as polymer resin. The trace extends in a predetermined pattern that is surrounded by bare substrate that electrically insulates segments of the trace. Thus, the substrate includes a first region to which the trace is applied and a second, adjacent region at which the substrate is exposed.

One method for forming a trace comprises selectively electroplating metal onto the desired region. Because the substrate is non-conductive, a thin metal film, preferably formed also of copper, is first applied to the substrate to conduct electrical current that is essential for plating. This initial metal film is deposited onto the entire area, including both the first region and the second region, to improve distribution of the current and obtain more uniform plating. A photolithographic mask is applied to the metal film and has openings that expose the metal film at the first region to limit plating to the desired pattern of the trace. Following plating, the mask is removed, thereby exposing the thin film in the second region for removal by a metal etching process. This etch-back is typically carried out using an aqueous etching solution. Because the etching solution also attacks the plated metal, the plating operation is extended to deposit surplus metal onto the first region that is sacrificed during etching. This adds to the processing time and material costs of the product. In addition, the solution etches exposed surfaces at a uniform rate, including side surfaces of the trace, which tends to produce undercutting.

It is known to remove unwanted metal using a laser beam to heat and vaporize the metal. Such laser ablation commonly involves focusing the beam on a very small area so that the pulse only irradiates the unwanted metal, and then scanning the substrate to progressively clear the region. This scanning process is time-consuming and requires care to aim the pulse to avoid the desired metal.

Therefore, there remains a need for an improved etch-back process that uses a laser beam for removing unwanted sections of a metal layer to define a feature, such as a circuit trace or the like, and that permits a relatively large area of a substrate to be concurrently treated with the laser beam to remove metal from one region without disturbing metal on an adjacent, co-irradiated region.

SUMMARY OF THE INVENTION

This invention contemplates a laser etch-back process for forming a metal feature on a first region of a surface area of a non-metallic substrate, which area includes a second region adjacent to the first region whereat the substrate is bare. The process comprises applying a metal layer to the area that includes a thick section overlying the first region and a thin section overlying the second region. The layer, including both the thick section and the thin section, is uniformly irradiated with a laser pulse effective to vaporize the thin section without ablating the thick section. In this manner, the laser beam etches the thin section to expose the second region, without removing metal from the thick section to form the desired metal feature.

In a preferred embodiment, the process of this invention is applied to form an electroplated copper trace on a polymer substrate. The area is initially coated with a thin metal film, also preferably formed of copper, suitable for uniformly distributing an electroplating current. A photolithographic mask is applied to the area and has openings that expose the metal film in a pattern corresponding to the desired trace. The masked substrate is immersed in an aqueous solution containing copper ions, and the thin film is cathodically biased to reduce the copper ions and thereby plate metallic copper onto the exposed film. The resulting metal layer thus comprises a thick section formed mainly of the electroplated copper and overlying the first region, and a thin section formed of the unplated metal film and overlying the second region. In accordance with this invention, the layer is then irradiated with a uniform laser pulse to remove the thin section, but not the thick section, and thereby define the trace.

Therefore, this invention provides an improved etch-back process for selectively removing metal from polymer or other suitable non-metal to thereby define a metal feature on a dielectric substrate. The process utilizes a metal layer that substantially covers an entire area, but removes metal only from a predetermined region. It is a significant advantage of this invention that the laser beam uniformly irradiates a relatively large area, thereby permitting the area to be quickly and conveniently treated. Nevertheless, the process is highly selective in confining etching to the thin section, but not the thick section, thereby avoiding the need for sacrificial metal to be added to the thick section. This surprising result is attributed to the increased mass of the thick section, which is able to dissipate heat created by the laser pulse, in contrast to the concentration of the laser heat that occurs within the thin section. In any event, the process of this invention is effective to completely remove metal from a prescribed region to expose a bare substrate, without removing metal from an adjacent region whereat the metal is desired to produce a useful feature in the product. By removing only metal from the thin section, the process is particularly well suited to building up a circuit trace or other metal feature using electroplating techniques that include an initial metal film applied to an entire area, and permits unwanted sections of the film to be removed quickly and conveniently following plating.

DESCRIPTION OF THE DRAWINGS

The present invention will be further illustrated with reference to the accompanying drawings wherein:

FIG. 1 is a partial plan view of a circuit board manufactured in accordance with this invention;

FIG. 2 is a plan view of an area of a substrate for manufacturing the board in FIG. 1, and FIGS. 3A-3F shows a cross sectional view of the substrate in FIG. 2 at various stages of a process for forming metal features thereon in accordance with this invention.

DETAILED DESCRIPTION OF THE INVENTION

Figure 3C:
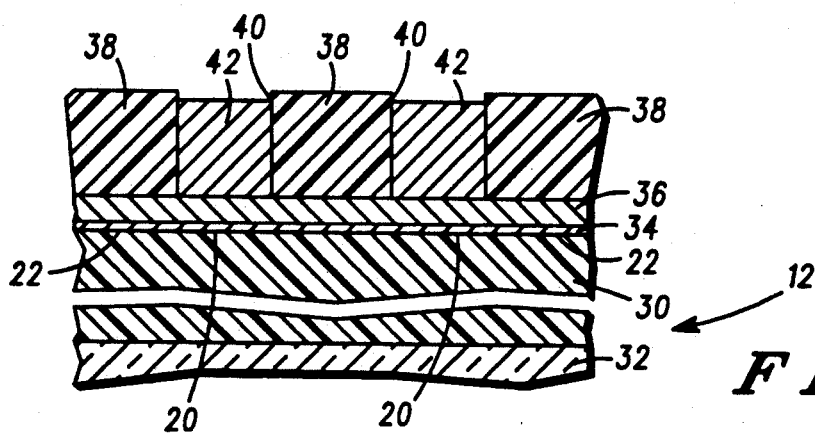

In accordance with a preferred embodiment, the process of this invention is employed to produce a circuit board 10 in FIG. 1, that is an intermediate in the manufacture of a high density, multi-layer circuit board. Board 10 comprises a substrate 12 having a generally planar major surface 14, and a metal trace 16 applied to surface 14. For purposes of illustration, only a minor portion of board 10 is shown in FIG. 1, it being understood that the board includes additional portions onto which trace 16 extends.

Referring to FIG. 1, substrate 12 is divided into a series of areas, including areas 18 and 19 indicated by the dashed lines. In this embodiment, the process for forming trace 16 includes some steps, particularly relating to metal deposition, that are carried out to concurrently treat the entire surface 14, whereas other steps, particularly relating to laser etching, are preformed on each area individually, so that the areas are treated sequentially to complete the treatment of surface 14.

FIG. 2 shows an enlarged view of area 18 prior to formation of trace 16. This invention is better understood by reference to first regions 20 of area 18 onto which trace 16 is to be formed and second regions 22 that are intended to be bare following processing.

Referring to FIG. 3A, there is shown a cross-sectional view of substrate 12 at area 18. Substrate 12 comprises a polyimide layer 30 carried on an alumina or other suitable ceramic carrier 32. Polymer layer 30 is composed of a polyimide compound commercially available from DuPont Company under the trade designation Pyralin 2611. Layer 30 is approximately 25 microns thick and forms surface 14.

A duel layer metal coating 33 is initially applied to entire surface 14 in preparation for electroplating. Coating 33 comprises a thin chromium metal film immediately adjacent polymer layer 30 and an outermost thin copper film 36 deposited onto chromium film 34. Chromium film 34 is initially deposited by sputtering in a low pressure argon atmosphere and has a uniform thickness between about 450 Å and 550 Å. Chromium film 34 substantially covers surface 14, including both regions 20 and 22, and enhances bonding of the subsequent applied copper to the polyimide. Thereafter, a copper film 36 is sputter deposited in a low pressure argon atmosphere onto chromium film 34 to uniformly cover surface 14, including both regions 20 and 22. Copper film 36 is about 0.5 micron thick and provides reduced electrical resistance, particularly in comparison to chromium film 34, to conduct electroplating current.

Referring to FIG. 3B, a photoresist mask 38 is applied to copper film 36 to protectively overlie regions 22 and defines openings 40 to expose the copper film at regions 20. Mask 38 is formed of a positive photoresist material applied as a uniform liquid layer and cured by heating at about 100° C. Mask 38 is developed by photolithographically exposing regions 20 to ultraviolet light and removing the exposed regions using an aqueous alkaline development solution. The resulting photoresist mask has a thickness of about 3.0 microns overlying regions 20 to provide an electrically insulative covering to prevent electrodeposition thereon.

Referring to FIG. 3C, substrate 12 carrying mask 38 is then immersed in an aqueous copper sulfate plating solution spaced apart from a suitable counterelectrode and cathodically biased to deposit a copper plate 42 onto copper film 36 through openings 40 in mask 38. A suitable plating solution comprises between about 195 and 248 grams per liter copper sulfate and between about 30 and 75 grams per liter concentrated sulfuric acid dissolved in water. A plating current of about 15 amps per square foot is applied to film 36 to reduce the dissolved copper ions at the exposed regions to thereby deposit metallic copper plate 42 having a copper thickness of about 2.5 microns.

Figure 3D:
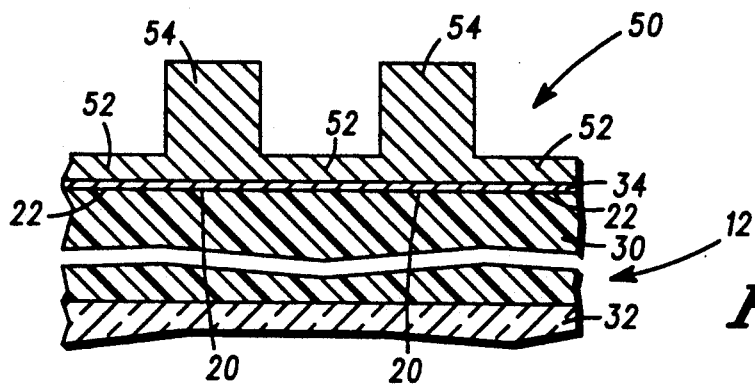
Figure 3E:
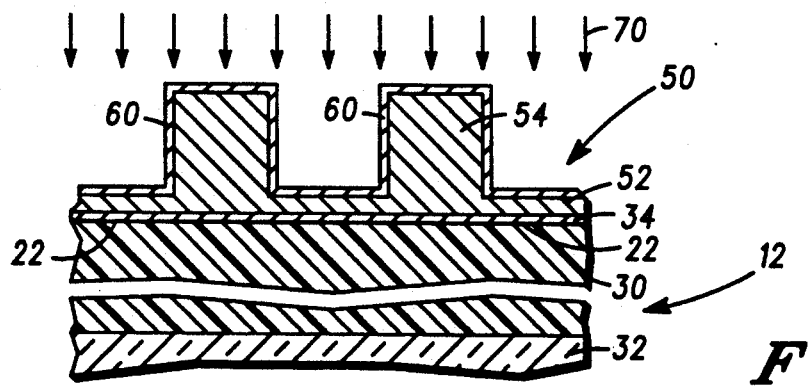
Figure 3F:
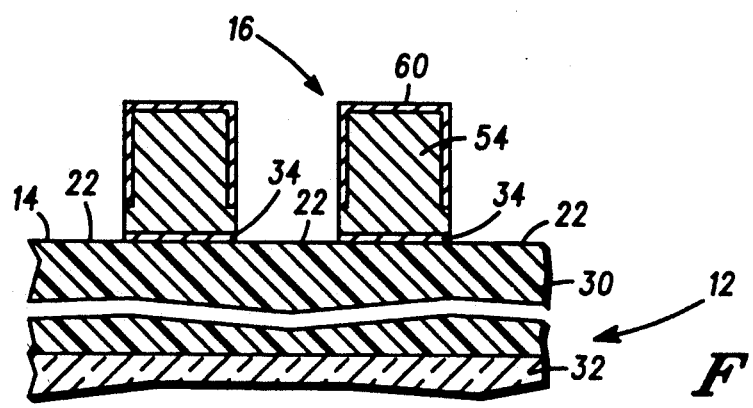

Following plating, mask 38 is removed to reveal a copper layer 50 shown in FIG. 3D. Layer 50 comprises thin sections 52 overlying regions 22 and formed solely of sputtered metal coating 33 and thick sections 54 overlying regions 20. Thick sections 54 are formed predominantly of electroplated copper, which merges indistinguishably with the sputtered copper. In accordance with this embodiment, a chromium coating 60 shown in FIG. 3F is sputter deposited onto copper layer 50. Chromium coating 60 is about 500 Å thick and uniformly covers thick section 52 and thick section 54.

In accordance with the process of this invention, coated layer 50 is etched using an excimer laser beam to remove thin sections 52 to expose the underlying region 22. Accordingly, an excimer laser apparatus is aimed to direct a beam onto area 18 of substrate 12, using a shutter to confine the beam to the targeted area. Area 18 is irradiated by a series of pulses, indicated by arrows 70 in FIG. 3F and emitted by the laser in rapid succession. Each laser pulse had a fluence of about 300 millijoules per square centimeter and a duration on the order of about 30 nanoseconds. The pulses 70 heat the metal at thin sections 52 and expose polymer layer 30. However, significantly, thick sections 54 are virtually unaffected by the laser pulses. Referring to FIG. 1, the position of substrate 12 is shifted relative to the laser beam to target area 19 for irradiation in a manner similar to area 18 for removal of thin sections similar to sections 52. In this manner, areas of substrate 12 were sequentially irradiated to treat the entire surface 14 to etch the thin sections and thereby define the trace. As shown in FIG. 3G and in FIG. 1, the resulting trace is formed predominantly of copper section 54, but also includes chromium film 34 and chromium coating 60. Following etch-back, board 10 is ready for further processing to manufacture a multi-layer board, including receiving a further polyimide coating, whereupon chromium coating 60 enhances bonding of trace 60 to the subsequently applied polyimide.

Therefore in a preferred embodiment, this invention provides a laser etching process that allows a metal film to be applied to an entire surface to optimize electroplating and then quickly and conveniently removed from unwanted regions without disturbing the desired plated metal features. The process of this invention permits a relatively large area to be concurrently etched, in contrast to processes that focus a laser beam upon a small area and progressively scan the surface. Furthermore, this is accomplished without requiring a mask or other additional measures to protect the desired sections during etching. Nevertheless, the etch-back process of this invention is highly selective in removing the metal from the thin sections without damage to the thick sections.

A significant feature of this invention is the initial formation of a metal layer that substantially covers an area, including a region from which the metal is eventually removed, and having a thick section and a thin section. The metal layer overlies the substrate that is formed of a polymer or other suitable non-metal. As used herein, polymeric substrate refers to a substrate having a polymer surface. While not limited to any particular theory, it is believed that the laser pulse produces heat at the metal surface of both the thick section and the thin section at a uniform rate based upon the exposed surface area. In view of the intensity and short duration of the pulse, this laser heating occurs rapidly and is substantially limited to the metal layer because of the poor thermal capacity of thin underlying non-metal. Within the thin sections, the heat is concentrated to raise the metal temperature sufficient to cause vaporization. In contrast, the relatively larger mass of the thick section dissipates the heat and thereby maintains the metal at a temperature below the vaporization temperature. As a result, metal is selectively vaporized from the thin section, but not from the thicker section.

In the described embodiment, a chromium coating is applied to the copper base in preparation for receiving a subsequently applied polyimide layer. Thus, the etch-back removes both chromium and copper to reveal the underlying substrate. In an alternate embodiment, the process of this invention may be suitably carried out on a metal layer without the chromium or other metal coating. Thus, a copper or other metal film may be suitably applied to the area, selectively electroplated and directly irradiated with the uniform laser pulse to move the unwanted thin sections. In still another embodiment of this invention, the etch-back process may be employed to remove unwanted portions of a metal coating applied to a preformed metal feature. Accordingly, a metal feature may be formed on a first region of a substrate adjacent to an already bare second region. The entire area may be then coated with a metal, for example, by sputtering, and then irradiated to remove the unwanted coating from the second region, without disturbing the coating on the feature.

Thus, while in the described embodiment the thick sections are built up by electroplating, the process of this invention may be employed to etch-back a metal layer formed by any suitable technique and having thick sections and thin sections. In general, it is preferred that the metal layer incorporate thin sections having a thickness less than about 0.6 micron. The thick sections may be formed of any suitable metal having a thermal capacity sufficient to dissipate the heat of the laser pulse. For electroplating purposes, it is preferred that the initial layer be formed predominantly of a high conductivity metal, preferably copper, having a thickness between about 0.5 and 0.6 micron. Adequate mass for heat dissipation is provided by thick sections having an overall thickness greater than 3.0 microns and preferably between 3.0 and 4.0 microns. In accordance with the preferred embodiment wherein the thick sections are built up by electroplating, this process may be utilized in conjunction with conventional electroplating solutions for depositing gold, silver, palladium, platinum and nickel, in addition to copper.

In the described embodiment, the metal layer was etched by a series of pulses produced by an excimer laser apparatus. Although the laser etch-back process may be carried out utilizing any suitable laser device, an excimer laser is preferred to provide a pulse having a fluence that is sufficient to heat metal to vaporization, but nevertheless, suitably low to minimize damage to the underlying polymer when exposed. In general, it is desired to utilize a laser pulse having a fluence between about 200 and 600 millijoules per square centimeter, and preferably between 250 and 350 mullijoules per square centimeter.

While this invention has been described in certain embodiments thereof, it is not intended that it be limited to the above description but rather only to the extent set forth in the claims that follow.

The embodiments of the invention in which an exclusive property or privilege is claimed are defined as follows:

1. A laser etch-back process for forming a metal feature on an area of a non-metallic substrate, said process comprising
   applying a metal layer to the area, said metal layer comprising a first section having a first thickness and said second section having a second thickness substantially less than said first thickness, and
   irradiating the metal layer with a laser pulse such that the pulse uniformly irradiates the first section and the second section and is effective to heat the second section to vaporize the metal without vaporizing metal from the first section, whereby said second section is vaporized to expose the substrate and further whereby the first section survives said irradiation to form the metal feature.

2. The process of claim 1 wherein the substrate comprises a polymer surface.

3. The process of claim 1 wherein the metal layer is formed predominantly of a metal selected from the group consisting of copper, nickel, gold, silver, palladium and platinum.

4. The process of claim 1 wherein the first section is formed predominantly of electroplated metal.

5. The process of claim 1 wherein the laser pulse is emitted by an excimer laser apparatus.

6. A laser etch-back process for forming a metal feature on an area of a polymeric substrate, said area comprising a first region and a second region, said process comprising
   applying a continuous metal layer to substantially cover the area, said layer comprising a first section overlying a first region of the area and having a thickness of at least about 2.5 microns and a second section overlying a second region of the area and having a thickness less than about 0.6 microns, and
   uniformly irradiating the metal layer with a laser pulse to heat the metal layer, said pulse having a uniform fluence effective to heat the second section to a temperature sufficient to vaporize the metal but not sufficient to heat the first section to vaporize the metal, said irradiation continuing for a time sufficient to vaporize metal from the second section to expose the substrate.

7. The process of claim 6 wherein the first section is formed predominantly of a metal selected from the group consisting of copper, nickel, gold, silver, palladium and platinum.

8. The process of claim 6 wherein the metal layer is formed predominantly of copper metal.

9. The process of claim 6 wherein the metal layer is formed predominantly of copper and includes a thin non-copper coating selected from the group consisting of chromium, titanium and nickel.

10. The process of claim 6 wherein first section has a thickness between about 3.0 and 4.0 microns.

11. The process of claim 6 wherein second section has a thickness between about 0.5 and 0.6 microns.

12. The process of claim 6 wherein the laser beam has a fluence between about 200 and 600 millijoules per square centimeter.

13. A laser etch-back process for forming a copper trace on a polymeric substrate, said substrate including an area comprising a first region and a second region such that the trace overlies the first region and is bounded by the second region whereat said substrate is exposed, said process comprising
   depositing a thin metal film having a uniform thickness onto the substrate such that the film substantially covers the area,
   selectively electrodepositing a copper plate onto the film overlying the first region to form a metal layer comprising a thick section overlying said first region and a thin section formed by said film overlying the second region, and
   irradiating the metal layer with a laser beam such that the beam uniformly irradiates the thick section and the thin section, said beam having a fluence sufficient to heat the thin section to a temperature effective to vaporize the metal and thereby expose the substrate thereat, but not to vaporize metal at the thick section to thereby produce said trace.

14. The process of claim 13 wherein the metal film comprises a copper film and wherein the copper plate is deposited directly onto the copper film.

15. The process of claim 13 wherein the metal film thickness is less than about 0.6 micron thick, and wherein the thick section has a thickness greater than about 2.5 microns.

16. The process of claim 13 wherein the metal film thickness is between about 0.5 and 0.6 micron, and wherein the thick section has a thickness between about 3.0 and 4.0 microns.

17. The process of claim 13 further comprising coating the metal layer prior to irradiating with a coating formed of non-copper metal.

18. The process of claim 13 wherein the polymeric substrate comprises a polyimide resin.

19. A laser etch-back process for forming a predominantly copper trace on planar surface of a polymeric substrate, said surface comprising an area that includes a first region and a second region such that the trace is formed on said first region and is adjacent to the second region whereat said substrate is exposed, said process comprising
   depositing a metal coating onto the substrate such that the coating covers the area, said coating comprising an outermost copper film and having a thickness less than about 0.6 micron,
   applying a polymeric mask onto the substrate to overlie the metal coating, said mask covering the second region and having openings at said first region whereat the copper film is exposed,
   immersing the masked substrate into an electroplating bath containing a reducible copper ion, while cathodically biasing the metal coating to reduce the copper ion to deposit a metallic copper plate onto the copper film through the openings in the mask, whereby the copper plate cooperates with the metal coating to form a metal layer comprising a thick section at the first region that includes the copper plate and has a thickness greater than about 2.5 microns and a thin section at the second region derived from the metal coating underlying the mask,
   removing said polymeric mask from the substrate to expose the thin section, and
   irradiating the metal layer with a laser pulse such that the laser pulse uniformly irradiates the first section and the second section, said laser pulse having a uniform fluence between about 200 and 600 millijoules per square centimeter and effective to heat said second section to a temperature sufficient to vaporize the metal to expose the substrate, the first section dissipating heat generated by the laser beam to maintain a temperature less than the metal vaporization temperature, whereby the thick section survives the irradiation to form the copper trace.

20. The process of claim 19 wherein the polymeric substrate includes a surface layer composed of a polyimide resin.

21. The process of claim 19 wherein the metal coating comprises a thin chromium film immediately adjacent to the polymeric substrate and underlying the copper film to enhance bonding of the copper to the substrate.

22. The process of claim 19 further comprising applying a thin chromium coating to the metal layer prior to irradiation.

23. The process of claim 19 wherein the metal coating is deposited by sputtering and has a thickness between about 0.5 and 0.6 micron.

24. The process of claim 19 wherein the thick section has a thickness between about 3.0 and 4.0 microns.

25. The process of claim 19 wherein laser pulse fluence is between about 250 and 350 millijoules per square centimeter.

26. A laser etch-back process for forming a predominantly copper trace on a planar surface of a polyimide substrate, said surface comprising an area that includes a first region and a second region such that the trace is formed on said first region and is adjacent to the second region whereat said substrate is exposed, said process comprising
   sputtering a dual metal coating onto the substrate such that the coating substantially covers the surface, said coating comprising a chromium film immediately adjacent the polyimide substrate and an outermost copper film, said coating having a thickness less than about 0.6 micron,
   applying a polymeric mask onto the substrate to overlie the metal coating, said mask covering the second region and having openings at said first region whereat the copper film is exposed,
   immersing the masked substrate into an aqueous electroplating bath containing a reducible copper ion, while cathodically biasing the metal coating to reduce the copper ion to deposit a metallic copper plate onto the copper film through the openings in the mask, whereby the copper plate cooperates with the metal coating to form a metal layer comprising a thick section at the first region that includes the copper plate and has a thickness between about 3.0 and 4.0 microns and a thin section at the second region derived from the metal coating underlying the mask,
   removing said polymeric mask from the substrate to expose the thin section, depositing a chromium coating having a substantially uniform thickness onto the copper layer to form a coated layer, and irradiating the coated layer at said area with one or more laser pulses produced by an excimer laser apparatus, said area being irradiated such that the laser pulse uniformly irradiates the first section and the second section, and has a uniform between about 250 and 350 millijoules per square centimeter, said pulses being effective to heat said second section to a temperature sufficient to vaporize the metal to expose the substrate, the first section dissipating heat generated by the laser pulse to maintain a temperature less than the metal vaporization temperature, whereby the thick section survives the irradiation to form the copper trace.

27. The process of claim 26 further wherein the surface includes a first area and a second area, and wherein the process further comprises irradiating the first area with said laser pulses and thereafter irradiating the second area with said laser pulses,

* * * * *